US008687381B2

(12) United States Patent
Iwata et al.

(10) Patent No.: US 8,687,381 B2
(45) Date of Patent: Apr. 1, 2014

(54) WIRING STRUCTURE FOR ELECTRONIC APPARATUS, AND ELECTRONIC APPARATUS

(75) Inventors: Naoyuki Iwata, Kanagawa (JP); Atsushi Aketo, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 301 days.

(21) Appl. No.: 12/857,861

(22) Filed: Aug. 17, 2010

(65) Prior Publication Data

US 2011/0182049 A1 Jul. 28, 2011

(30) Foreign Application Priority Data

Jan. 26, 2010 (JP) ................................ 2010-014411

(51) Int. Cl.
*H05K 5/02* (2006.01)

(52) U.S. Cl.
USPC ........... 361/826; 361/827; 361/828; 361/807; 361/688; 361/679.49; 174/72 A; 174/72 R

(58) Field of Classification Search
USPC ............. 361/826, 82, 828, 7; 174/72 A, 72 R
See application file for complete search history.

(56) References Cited

U.S. PATENT DOCUMENTS

| | | | | |
|---|---|---|---|---|
| 5,012,391 | A * | 4/1991 | Schultz et al. | 361/826 |
| 5,285,349 | A * | 2/1994 | Zander et al. | 361/641 |
| 6,541,704 | B1 * | 4/2003 | Levenson et al. | 174/72 A |
| 7,258,583 | B1 * | 8/2007 | Baiza | 439/719 |
| 2005/0047819 | A1 | 3/2005 | Otoguro et al. | |
| 2005/0217888 | A1 | 10/2005 | Arai et al. | |
| 2010/0014268 | A1 * | 1/2010 | Kadivar et al. | 361/807 |
| 2010/0039838 | A1 * | 2/2010 | Carpenter | 363/52 |

FOREIGN PATENT DOCUMENTS

| | | |
|---|---|---|
| JP | 55-088277 | 12/1978 |
| JP | 63-039987 U | 3/1988 |
| JP | 03-039884 U | 4/1991 |
| JP | 2002-258715 A | 9/2002 |
| JP | 2005-096427 A | 4/2005 |
| JP | 2005-144955 A | 6/2005 |
| JP | 2005-295728 A | 10/2005 |

OTHER PUBLICATIONS

Communication from the Japanese Patent Office dated Oct. 9, 2013, in a counterpart Japanese application No. 2010-014411.

* cited by examiner

*Primary Examiner* — Tuan T Dinh
*Assistant Examiner* — Steven T Sawyer
(74) *Attorney, Agent, or Firm* — Sughrue Mion, PLLC

(57) ABSTRACT

A wiring structure for an electronic apparatus has a structure in which a first wiring path where a first harness that is used for transmitting a primary power is wired and a second wiring path where a second harness that is used for transmitting a secondary power is wired are formed, and a structure related to the first wiring path is formed so that, in a case where the first harness is wired, the first harness is integrated with the structure related to the first wiring path.

15 Claims, 15 Drawing Sheets

WIRING STRUCTURE FOR ELECTRONIC APPARATUS, AND ELECTRONIC APPARATUS

CROSS-REFERENCE TO RELATED APPLICATIONS

This application is based on and claims priority under 35 USC 119 from Japanese Patent Application No. 2010-014411 filed on Jan. 26, 2010.

BACKGROUND

1. Technical Field

The present invention relates to a wiring structure for an electronic apparatus, and also to an electronic apparatus.

2. Related Art

An image forming apparatus uses a low voltage power supply (LVPS) in order to supply a DC voltage (low voltage) of, for example, 5 V or 24 V to secondary power supply destinations such as a driving motor for driving various image forming members. In such a low voltage power supply (LVPS), an AC voltage of, for example, 100 V which is a commercial power supply supplied from an outlet is turned ON/OFF by a switching element, the voltage which is obtained by the switching ON/OFF is lowered to a predetermined voltage by a transformer, and the lowered voltage is rectified by a rectifier to produce the DC voltage (low voltage). The thus produced DC voltage is supplied toward the secondary power supply destinations.

SUMMARY

According to an aspect of the invention, there is provided a wiring structure for an electronic apparatus wherein the wiring structure has a structure in which a first wiring path where a first harness that is used for transmitting a primary power is wired, and a second wiring path where a second harness that is used for transmitting a secondary power is wired are formed, and a structure related to the first wiring path is formed so that, in a case where the first harness is wired, the first harness is integrated with the structure related to the first wiring path.

BRIEF DESCRIPTION OF THE DRAWINGS

Exemplary embodiments of the present invention will be described in detail based on the following figures, wherein.

DESCRIPTION OF REFERENCE NUMERALS AND SIGNS

Figure 1:
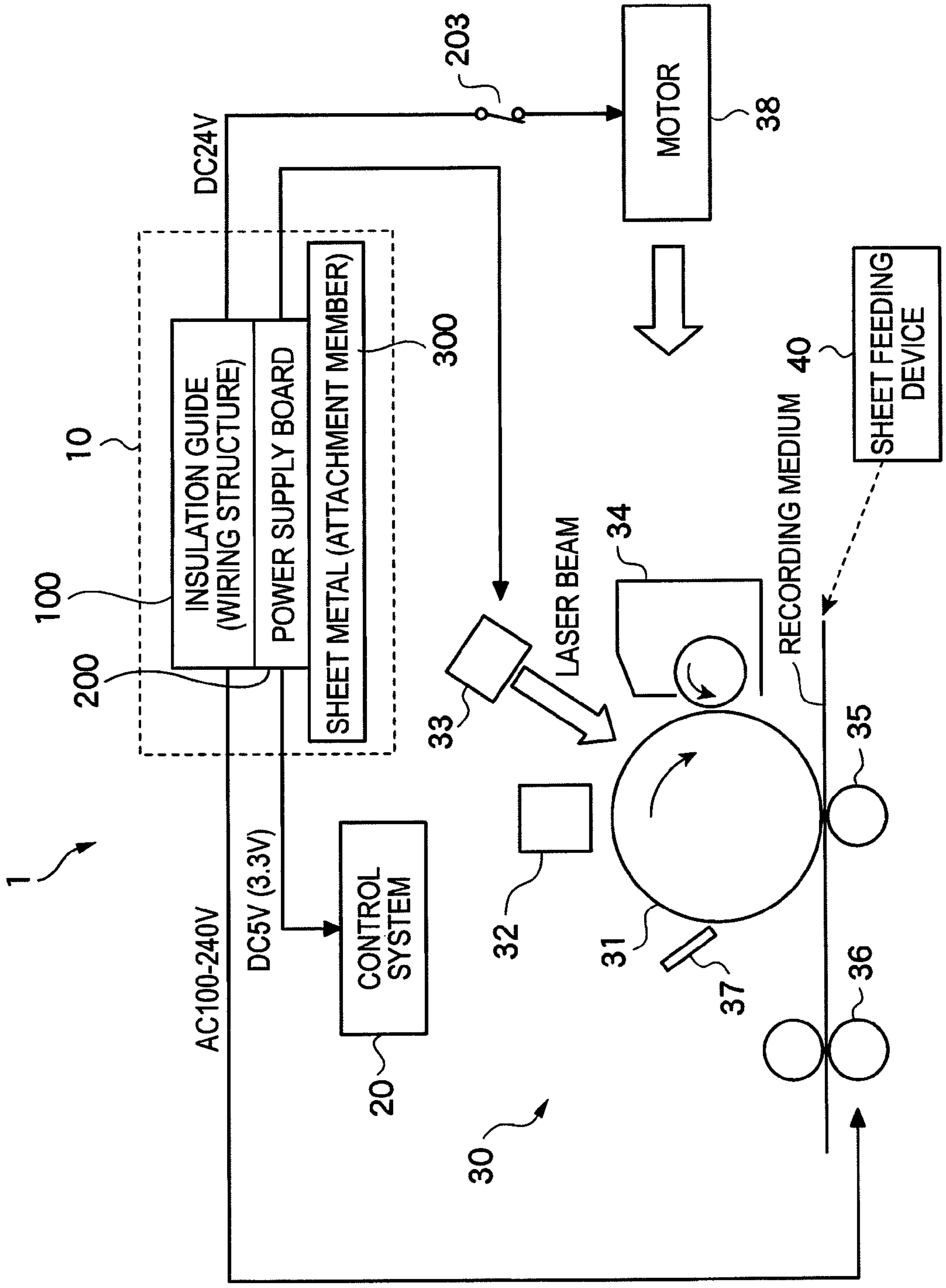
FIG. 1 is a diagram showing the configuration of an image forming apparatus of an exemplary embodiment.

1 image forming apparatus
10 power supply unit
20 control system
30 image forming unit
33 optical scanning device
36 fixing device
38 motor
100 insulation guide
101 first wiring path
102 second wiring path
110, 120, 140 side face member
111 opening
121, 141 restricting member
130, 150 bottom face member
200 power supply board
200A power supply circuit
201 first harness
202 second harness
270 overcurrent protection circuit
300 sheet metal
CN11A, CN11B, CN12A, CN12B connector
CN21A, CN21B, CN22A, CN22B connector

DETAILED DESCRIPTION

Hereinafter, an exemplary embodiment which is an example of the invention will be described in detail with reference to the drawings. In the drawings illustrating the exemplary embodiment, the identical components are denoted in principle by the same reference numerals, and their duplicated description will be omitted.

An image forming apparatus of the exemplary embodiment will be described with reference to FIG. 1.

The image forming apparatus 1 exerts the function of an electronic apparatus, and, as shown in FIG. 1, includes a power supply unit 10, a control system 20, an image forming unit 30, and a sheet feeding device 40.

The power supply unit 10 converts the primary power to the secondary power, and supplies the primary power to supply destinations (power consuming loads) of the power, and the secondary power to supply destinations (power consuming loads) of the power.

The power supply unit 10 has: an insulation guide 100 through which harnesses respectively used for transmitting primary and secondary powers are wired; a power supply board 200 having a power supply circuit which converts the primary power to the secondary power; and a sheet metal 300 serving as an attachment member to which the insulation guide 100 and the power supply board 200 are attached. The power supply unit 10 will be described in detail later.

The control system 20 has: a first controlling unit (not shown) which obtains print data from a computer (not shown) or the like, which converts the data to image data (raster data) in the image forming (printing) format, and which performs image processes such as color conversion and gray scale correction on the data; and a second controlling unit (not shown) which, on the basis of the image data supplied from the first controlling unit and control information, controls image formation of the image forming unit 30.

As shown in FIG. 1, the image forming unit 30 includes: a photosensitive drum 31 serving as an image carrier; a charging device 32 serving as a charging unit for charging the surface of the photosensitive drum 31 to a potential of a desired polarity; an optical scanning device 33 serving as an exposing unit for irradiating the charged surface of the photosensitive drum 31 with a laser beam (exposure light) corresponding to image data, thereby forming an electrostatic latent image on the surface of the photosensitive drum 31; a developing device 34 serving as a developing unit for supplying the electrostatic latent image formed on the photosensitive drum 31 with a developing agent (toner) to develop the image; a transfer roller (transferring device) 35 serving as a transferring unit for transferring the toner image formed on the photosensitive drum 31 to a recording medium such as a sheet; a fixing device (fuser) 36 serving as a fixing unit for applying heat and pressure to the recording medium to which the toner image is transferred, to fix the toner image; and a cleaning device 37 serving as a cleaning unit for removing residual toner residing on the peripheral surface of the photosensitive drum 31.

The image forming unit 30 further includes a motor 38 such as a DC servo motor and a stepping motor.

The DC servo motor is used as a driving motor for the photosensitive drum 31, a motor which is used for stirring the toner in the developing device 34, a roller driving motor for the transfer roller (fixing device) 36, and the like.

The stepping motor is used as a feed motor for a driving system, a registration motor for the optical scanning device 33, and the like.

In FIG. 1, the plurality of motors such as the above-described DC servo motor and stepping motor are generally indicated as the motor 38.

The sheet feeding device 40 houses recording media of standard sizes such as A4 and B5 sizes, and supplies a recording medium of the designated one of the standard sizes, to the image forming unit 30.

The power supply unit 10 supplies respective desired voltages (desired powers) which are suitable for the components to operate, to the control system 20, a heat source of the fixing device 36, and the motor 38. A desired voltage (desired power) is supplied to the motor 38 via an interlock switch 203 which will be described in detail later.

Next, the power supply unit 10 will be described in detail.

Figure 2:
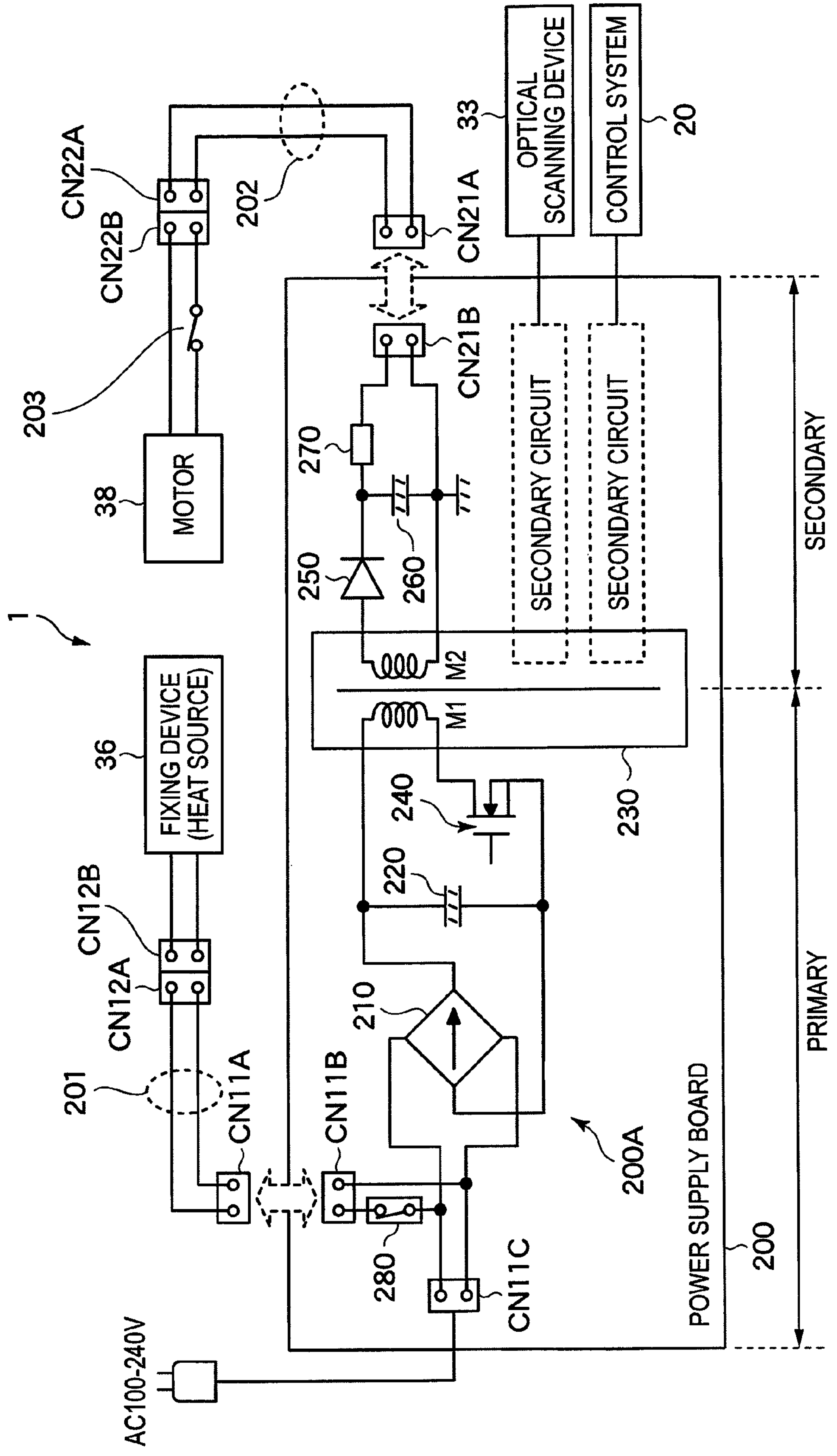
FIG. 2 is a diagram showing the configuration of a power supply circuit in a power supply board in the exemplary embodiment.

A power supply circuit 200A which is disposed in the power supply board 200 converts the primary power to the secondary power, and, as shown in FIG. 2, includes a rectifier (input rectifier) 210, a capacitor (input electrolytic capacitor) 220, a transformer 230, a switching element 240, a rectifier (output rectifier) 250, a capacitor (output electrolytic capacitor) 260, an overcurrent protection circuit 270, and a switch (SW) element 280.

In the exemplary embodiment, a ground-fault circuit breaker (earth leakage circuit breaker) is not connected to the primary side of the power supply circuit 200A.

The rectifier 210 rectifies the AC voltage (current) which is supplied from the input power supply such as a commercial power supply (AC power supply) through a connector CN11C.

The capacitor 220 smoothes the rectified voltage (current).

The transformer 230 lowers the smoothed voltage in accordance with the winding number ratio of the primary winding M1 and the secondary winding M2. In order to obtain a plurality of kinds of output voltages, one primary winding and a plurality of secondary windings are wound in the transformer 230.

The switching element 240 is caused to repeat ON/OFF switching operations at a high speed, by a high-frequency pulse signal which is supplied from a switching controlling unit (not shown).

As a result, a high-frequency pulse current flows through the primary winding M1 of the transformer 230, and an induced electromotive force is generated in the secondary winding M2.

The induced electromotive force is rectified to a DC voltage by the rectifier 250, smoothed by the capacitor 260, and then supplied as a DC voltage to power supply destinations (power consuming loads) through a connector CN21B.

The overcurrent protection circuit 270 exerts a function of a protecting unit, is disposed in the secondary side of the power supply circuit 200A of the power supply board 200, and prevents the output current of the power supply circuit 200A from flowing at a level higher than a specified level, thereby protecting the power supply circuit 200A or power supply destinations on the secondary side, such as the motor 38. The overcurrent protection circuit 270 further protects the power supply circuit 200A or the power supply destinations on the secondary side, such as the motor 38, from, for example, an overcurrent due to a short circuit of the secondary side. Examples of the overcurrent protection circuit 270 are a relay or a fuse.

The secondary winding M2 of the transformer 230, the rectifier 250, the capacitor 260, and the overcurrent protection circuit 270 constitute a secondary circuit.

In the exemplary embodiment, in the same manner as the above-described secondary circuit, other secondary circuits for obtaining other desired output voltages are formed.

The DC voltages produced in the power supply circuit 200A are supplied to the motor 38, the optical scanning device 33, and the control system 20 in accordance with their values.

A connector CN11A of a first harness 201 one end of which is connected to the connector CN11A and the other end of which is connected to a connector CN12A is connected to a connector CN11B disposed on the power supply board 200. The connector CN12A of the first harness 201 is connected to a connector CN12B of a harness one end of which is connected to the heat source (such as a heater) of the fixing device 36, and the other end of which is connected to the connector CN12B.

An AC voltage (current) which is supplied from the input power supply such as an AC power supply through the connector CN11C is provided to the fixing device 36 through the switch (SW) element 280, the connector CN11B, the first harness 201, and the connector CN12B.

In accordance with instructions from the fixing device 36 to a heater controlling unit (not shown), the switch (SW) element 280 is changed to the opened state (nonconductive state) or the closed state (conductive state) to ON/OFF control the energization of the fixing device 36. The switch element is configured by, for example, a triac.

A connector CN21A of a second harness 202 one end of which is connected to the connector CN21A and the other end of which is connected to a connector CN22A is connected to the connector CN21B disposed on the power supply board 200. The connector CN22A of the second harness 202 is connected to a connector CN22B of a harness one end of which is connected to the motor 38 and the other end of which is connected to the connector CN22B. The interlock switch 203 is connected between the motor 38 and the connector CN22B.

The interlock switch 203 is attached to an opening/closing lid (not shown, a lid of the body of the image forming apparatus). When the opening/closing lid is in the closed state, the interlock switch is in the ON state (conductive state), and, when the opening/closing lid is in the opened state, the interlock switch is in the OFF state (nonconductive state). Namely, the interlock switch 203 has a function of allowing or interrupting the energization in accordance with the opened/closed state of the opening/closing lid.

Next, the insulation guide 100 will be described with reference to FIG. 3.

Figure 3:
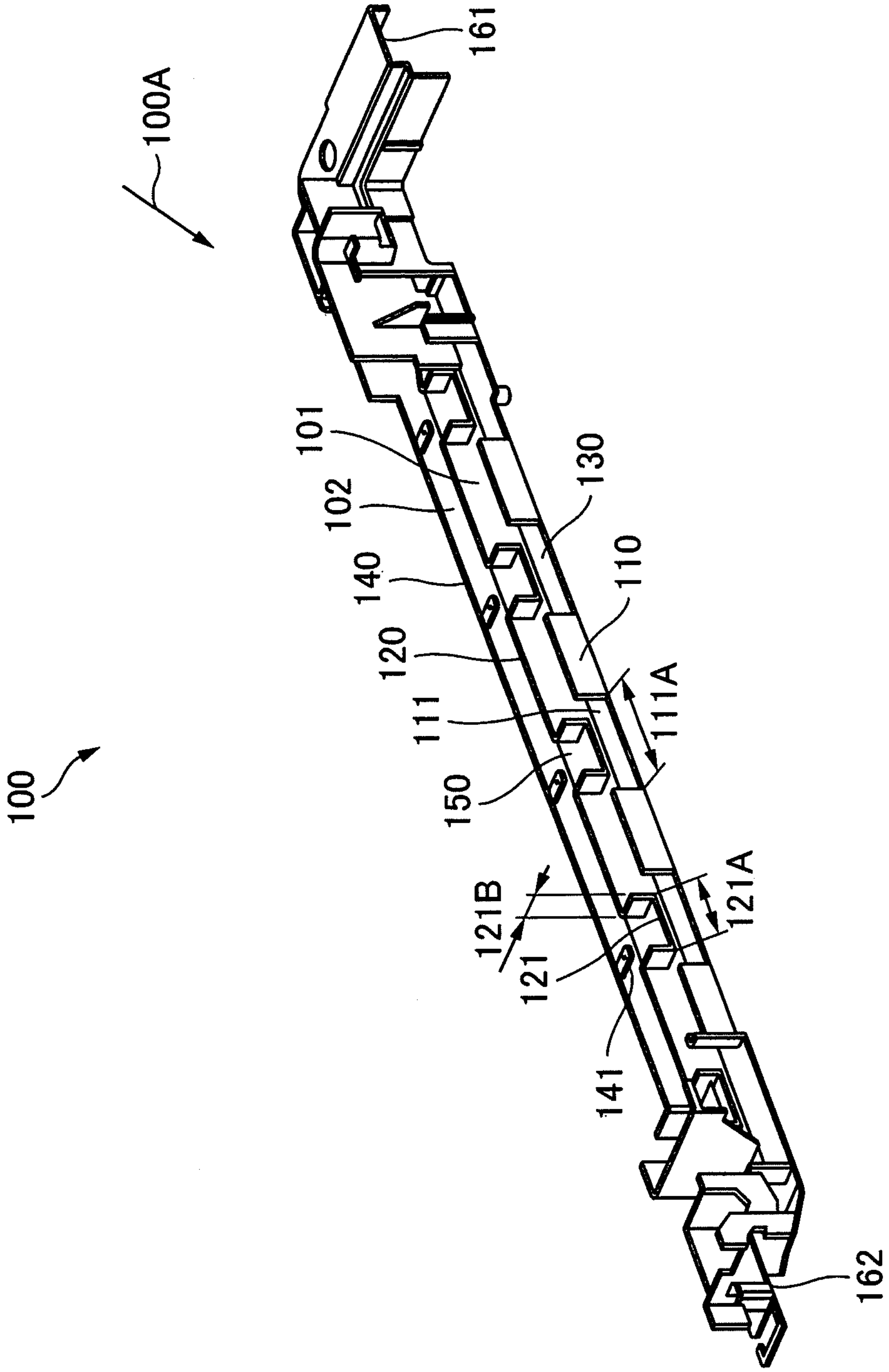
FIG. 3 is a perspective view showing an insulation guide in the exemplary embodiment.

The insulation guide 100 is configured by an insulation member, and formed into an L-like shape as shown in FIG. 3.

The insulation guide 100 has a structure in which a first wiring path 101 where the first harness 201 that is used for transmitting the primary power is wired, and a second wiring path 102 where the second harness 202 that is used for transmitting the secondary power are formed. The structure related to the first wiring path 101 is formed so that, in the case where the first harness 201 is wired, the first harness 201 is integrated with the structure.

The first harness 201 is a primary harness, and, as described above, transmits the primary power of the power supply circuit 200A to supply destinations of the power (power supply destinations) such as the heat source of the fixing device 36 (see FIG. 2).

The second harness 202 is a secondary harness, and, as described above, transmits the secondary power of the power supply circuit 200A to supply destinations of the power (power supply destinations) such as the motor 38 (in the example, the motor 38 through the interlock switch 203) (see FIG. 2).

The first wiring path 101 and the second wiring path 102 are formed to be parallel to each other (see FIGS. 3, 5, and 6), and the first wiring path 101 is formed in the level which is lower than the second wiring path 102 (see FIGS. 6A, 6B, 6C and 6D).

The structure related to the first wiring path 101 is formed into a recessed shape by a side face member 110, a side face member 120, and a bottom face member 130 (see FIGS. 6A, 6B, 6C and 6D).

The structure related to the first wiring path 101 is formed into a structure which restricts the first harness 201 wired in the first wiring path 101, from detaching from the first wiring path 101.

Namely, the structure related to the first wiring path 101 is configured in the following manner. In the side face member 110, as shown in FIG. 3, a plurality of openings 111 (see FIG. 5) having a predetermined length (length in the longitudinal direction of the first wiring path 101) 111A are formed at predetermined intervals in the longitudinal direction of the first wiring path 101 of the side face member 110.

Figure 5:
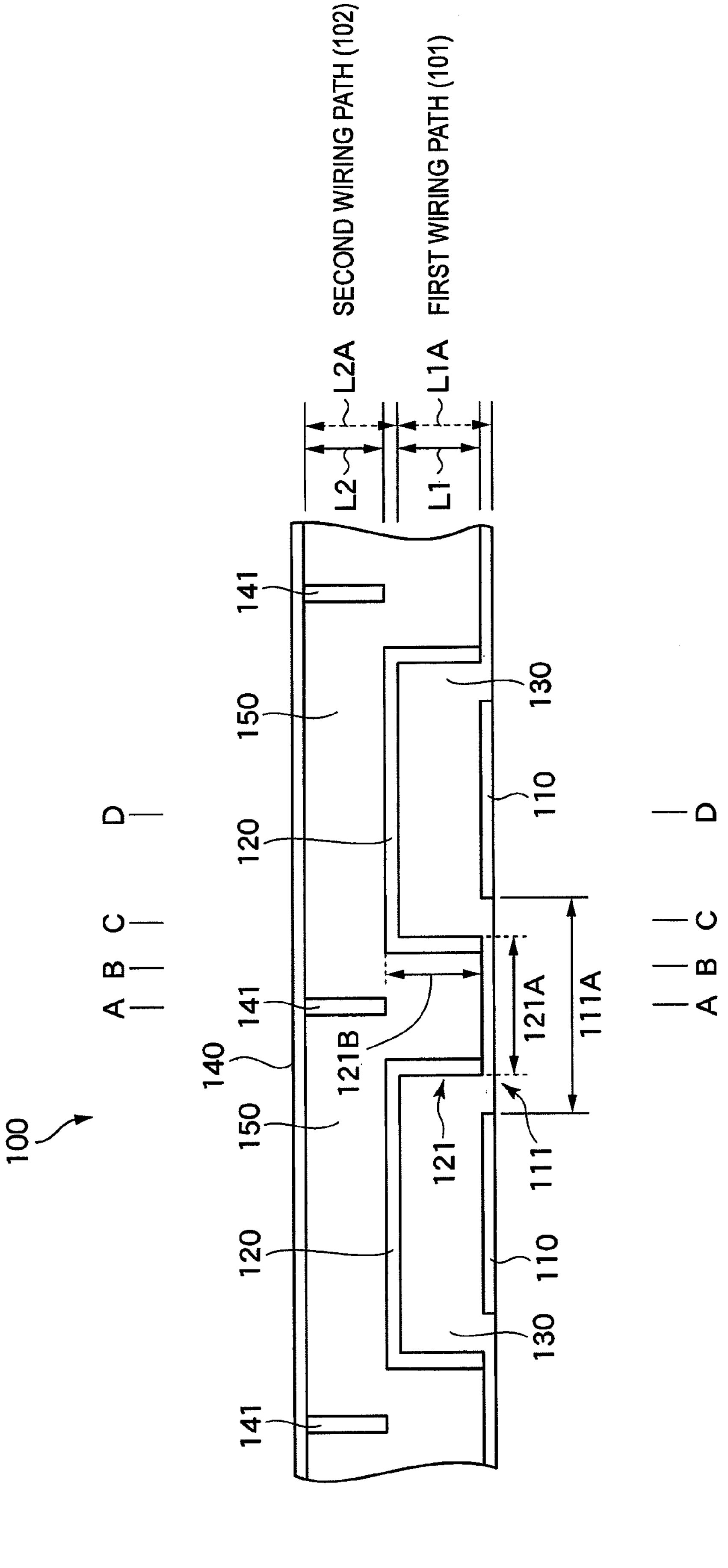
FIG. 5 is a front view showing the front of the insulation guide in the exemplary embodiment.

In order to allow two first harnesses 201 to be wired in parallel, as shown in FIG. 5, the width of the first wiring path 101 is equal to the distance (length) L1 between the opposed side faces of the side face members 110, 120.

The first harness 201 is wired by using the openings 111 of the side face member 110. As shown in FIG. 5, therefore, the width of the first wiring path 101 includes at least the distance (length) L1A between the side face of the side face member 120 which is opposed to the side face member 110, and the side face of the side face member 110 which is opposite to that opposed to the side face member 120. Consequently, the width of the first wiring path 101 includes the lengths L1 and L1A.

In the side face member 120, as shown in FIG. 3, a plurality of U-like members 121 (see FIG. 5) having a predetermined length (length in the longitudinal direction of the first wiring path 101) 121A and a width 121B are formed at predetermined intervals in the longitudinal direction of the first wiring path 101 of the side face member 120, so as to be opposed to the openings 111.

The distance between the bottom face member 130 and the face of each of the U-like members 121 which is opposed to the bottom face member 130 is set to the minimum value which is required to allow the first harness 201 to be wired in the first wiring path 101.

The members 121 have a function of a member which restricts the first harness 201 from detaching from the first wiring path 101. In the following description, therefore, the members 121 are referred to as the restricting members 121.

The length 121A of each of the restricting members 121 is set to be shorter than the length 111A of each of the openings 111. Moreover, the side face member 110, the openings 111, and the restricting members 121 are disposed so that spaces (regions) defined by end portions of the restricting members 121 which are opposed to the openings 111, and those of the side face member 110 which are adjacent to the openings 111, such as spaces (regions) enclosed by broken lines denoted by the reference numeral 205A in FIG. 13 described later are the minimum spaces (regions) that are required to allow the manufacturer (the worker in the factory, or the like) to be wired in the first harness 201 in the first wiring path 101.

The structure related to the second wiring path 102 is formed into a recessed shape by the side face member 120, a side face member 140, and a bottom face member 150 (see FIGS. 6A, 6B, 6C and 6D).

In the structure related to the second wiring path 102, a plurality of projecting restricting members 141 which restrict the second harness 202 that is wired in the second wiring path 102, from detaching from the second wiring path 102 are arranged at predetermined intervals in the longitudinal direction of the second wiring path 102 of the side face member 140. The length of the projecting portion of each of the restricting members 141 is set to be equal to the distance (length) between the two opposed side faces of the side face members 120, 140, or a length which is shorter than this length by a predetermined length (see FIGS. 5 and 6).

The distance between the bottom face member 150 and the face of each of the restricting members 141 which is opposed to the bottom face member 150 is set to be equal to the minimum distance which is required to allow the second harness 202 to be wired in the second wiring path 102.

Moreover, the side face member 120 and the restricting members 121, 141 are disposed so that spaces (regions) defined by end portions of the restricting members 141 which are opposed to the restricting members 121, and those of the side face member 120 which are adjacent to the restricting members 121, such as spaces (regions) enclosed by broken lines denoted by the reference numeral 205B in FIG. 13 described later are spaces (regions) that allow the maintenance person to easily wire or detach the second harness 202 in or from the second wiring path 102.

In order to allow two second harnesses 202 to be wired in parallel, as shown in FIG. 5, the width of the second wiring path 102 is equal to the distance (length) L2 between the opposed side faces of the side face members 120, 140.

The second harness 202 is wired (or detached) so as to extend around the tip ends of the projecting portions of the restricting members 141. As shown in FIG. 5, therefore, the width of the second wiring path 102 includes at least the distance (length) L2A between the side face of the side face member 140 which is opposed to the side face member 120, and the side face of the side face member 120 which is opposite to that opposed to the side face member 140. Consequently, the width of the second wiring path 102 includes the lengths L2 and L2A.

Figure 4:
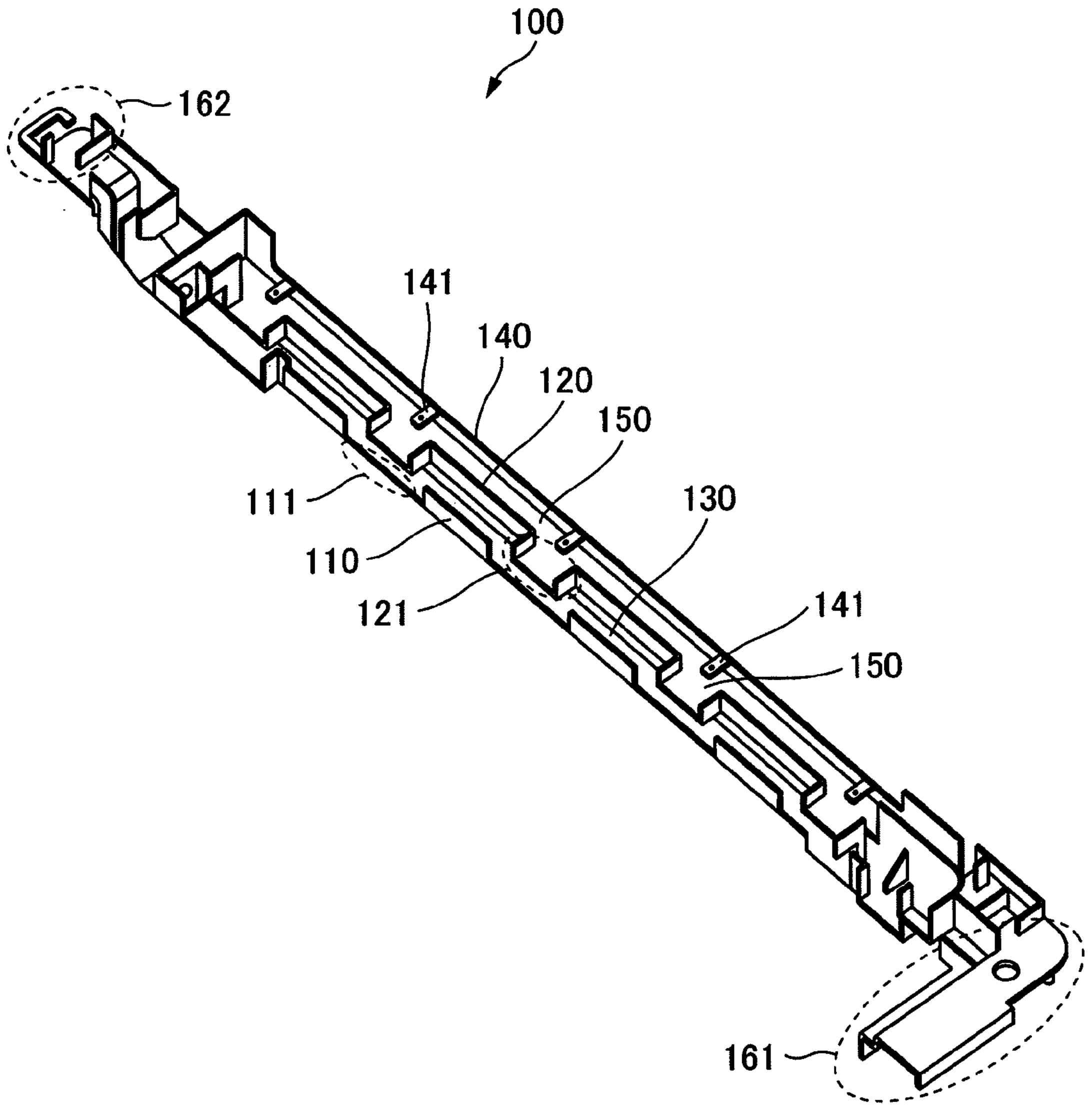
FIG. 4 is a perspective view showing the insulation guide in the exemplary embodiment, as viewed in a different direction.

FIG. 4 shows the insulation guide 100 of FIG. 3 as viewed in the direction (front direction) of the arrow 100A, and FIG. 5 shows a part of the front of the insulation guide 100.

Figure 6D:
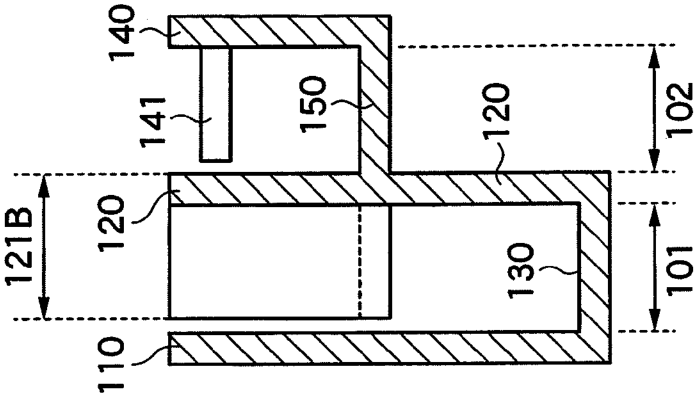
FIGS. 6A, 6B, 6C and 6D are sectional views respectively showing sections of a plurality of different portions of the insulation guide in the exemplary embodiment.
Figure 6C:
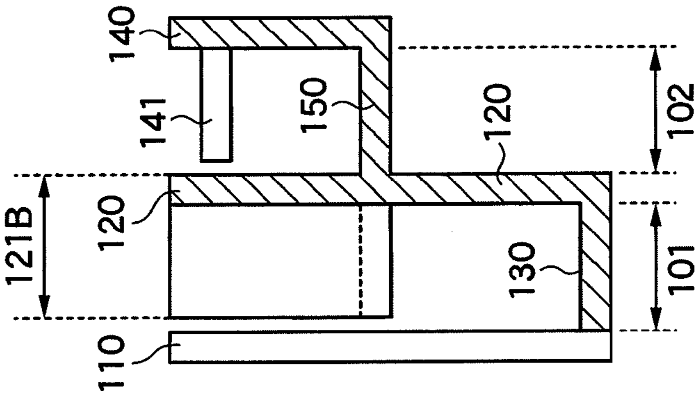
Figure 6B:
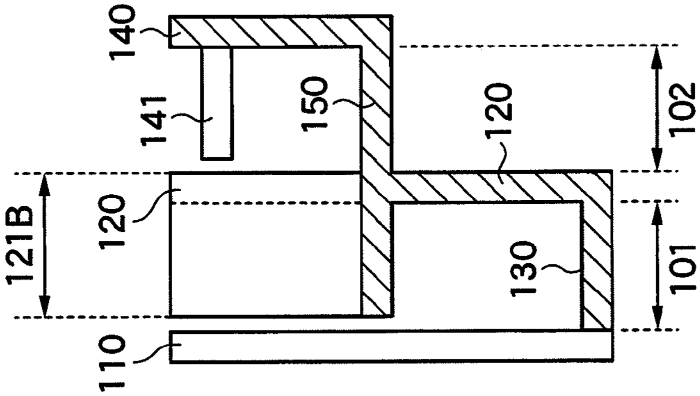
Figure 6A:
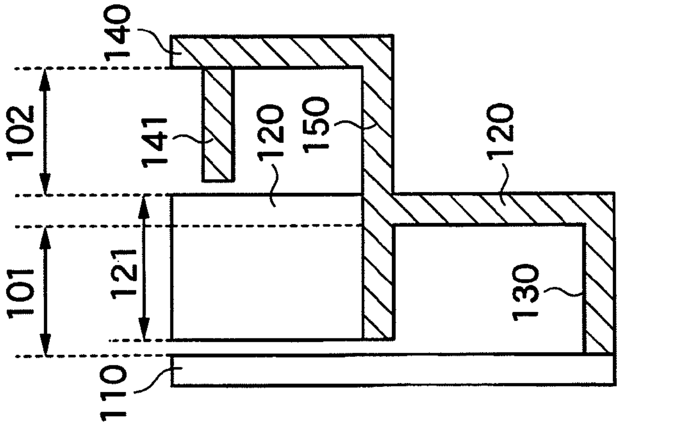

FIGS. 6A to 6D show sections A-A to D-D in a plurality of different portions (positions) of the insulation guide 100 shown in FIG. 5, respectively. Namely, FIG. 6A shows section A-A, FIG. 6B shows section B-B, FIG. 6C shows section C-C, and FIG. 6D shows section D-D.

Figure 7:
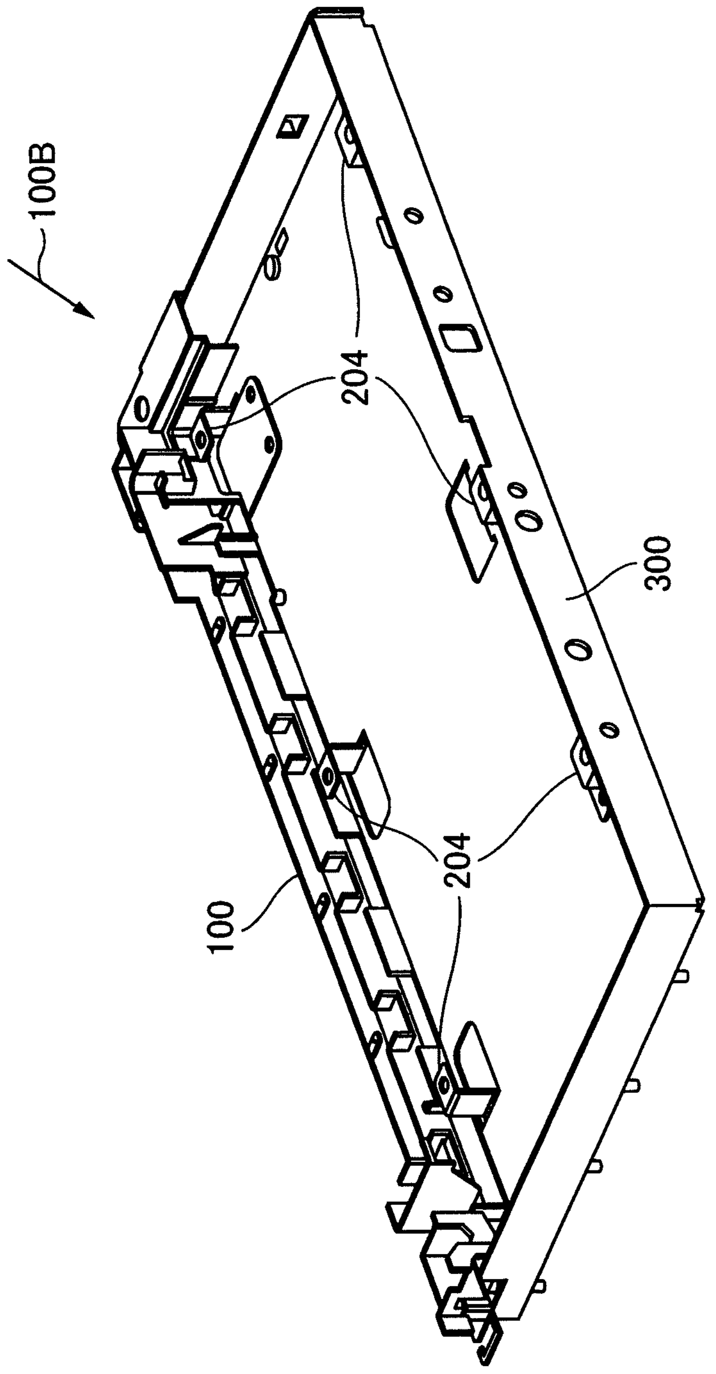
FIG. 7 is a perspective view showing a manner of attaching the insulation guide in the exemplary embodiment to a sheet metal.

FIG. 7 shows a manner in which the insulation guide 100 in a state where the first harness 201 and the second harness 202 are not wired is attached to the sheet metal 300. In this case, the insulation guide 100 is disposed so as to be attached or detached by using three of the four side face members of the sheet metal 300 and without using fixing members such as screws.

Six fixing members 204 each having a female screw for fixing the power supply board 200 by means of screwing are disposed in the sheet metal 300.

Figure 8:
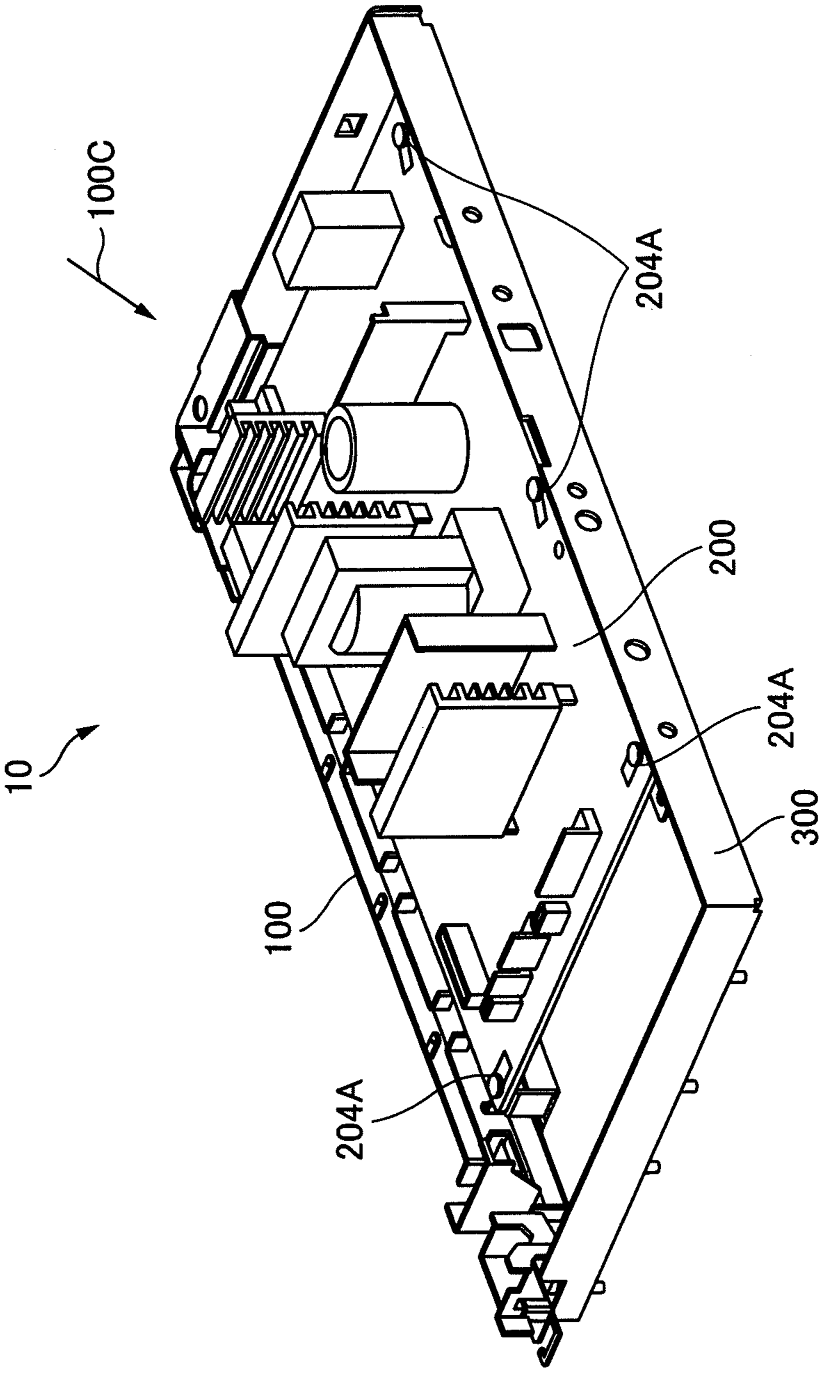
FIG. 8 is a perspective view showing a manner of attaching the insulation guide and power supply board in the exemplary embodiment to the sheet metal.

FIG. 8 shows a manner (state of the power supply unit 10) in which the power supply board 200 to which, in the state shown in FIG. 7, mounted components corresponding to the power supply circuit 200A are further disposed is attached to the sheet metal 300. In the power supply board 200, six holes through which screws (male screws) 204A are to be respectively passed are formed correspondingly with the placement positions of the six fixing members 204. Therefore, the power supply board 200 is fixed to the sheet metal 300 by the six screws 204A in a state where the positions of the female screws of the six fixing members 204 coincide with the six holes, respectively.

Figure 9:
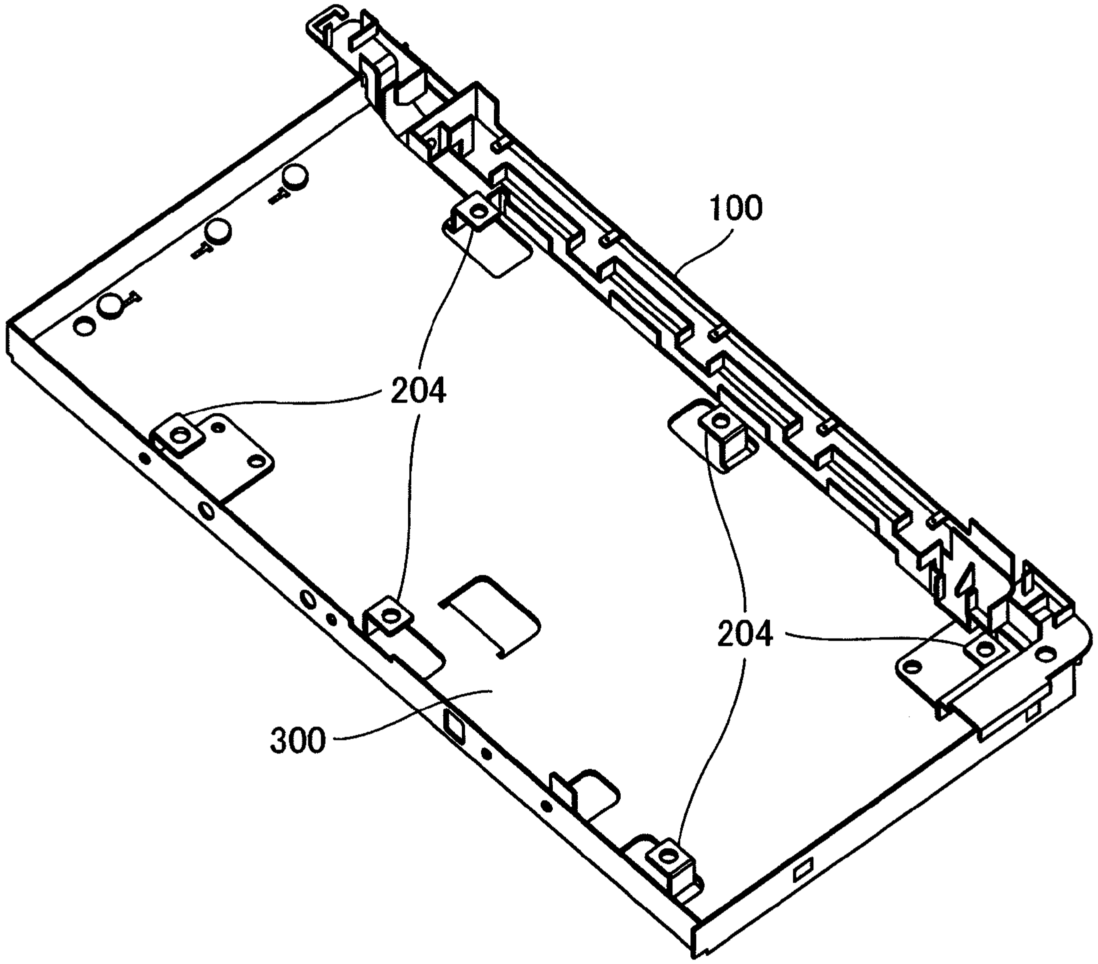
FIG. 9 is a perspective view showing the manner of attaching the insulation guide in the exemplary embodiment to the sheet metal, as viewed in a different direction.
Figure 10:
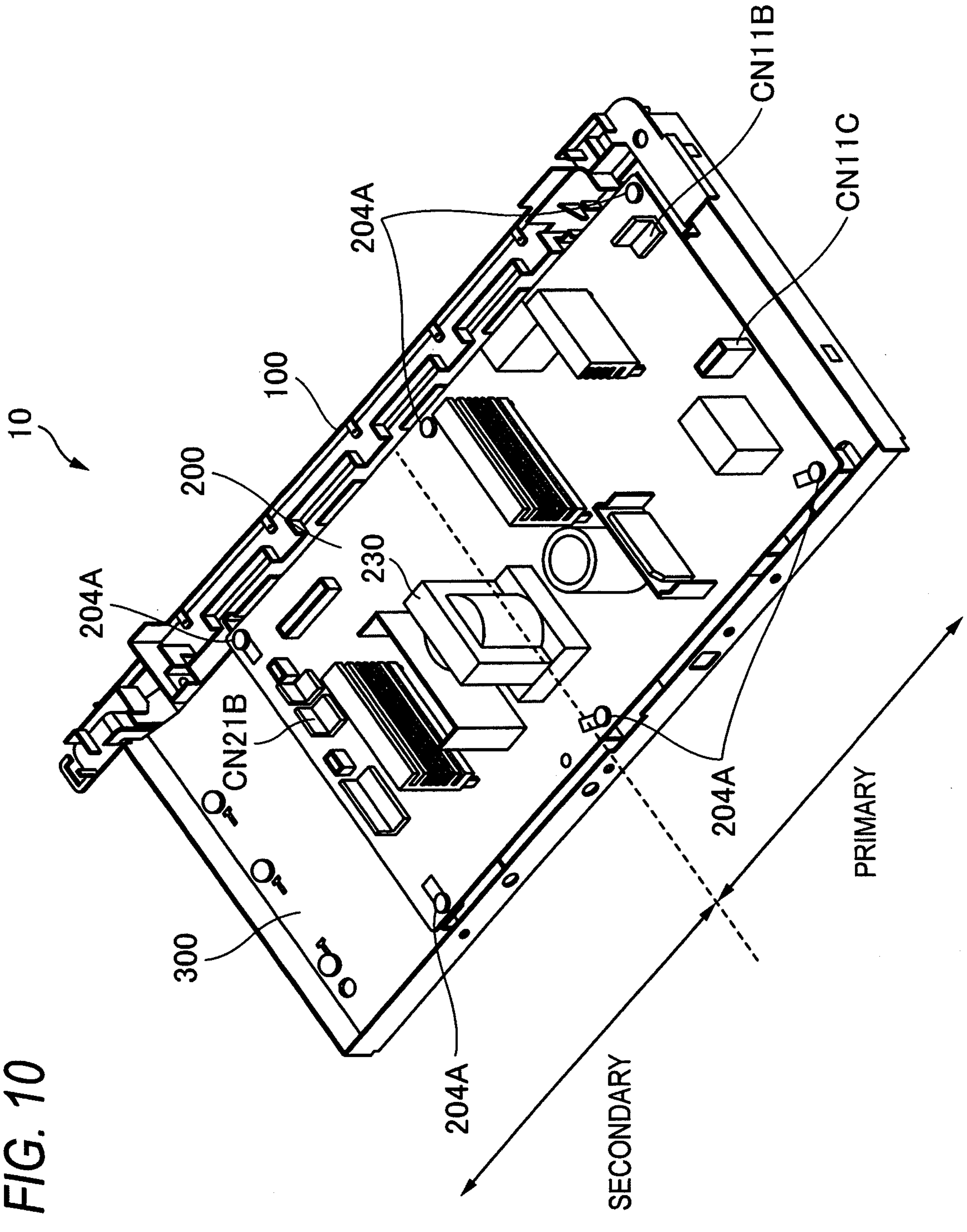
FIG. 10 is a perspective view showing the manner of attaching the insulation guide and power supply board in the exemplary embodiment to the sheet metal, as viewed in a different direction.

FIG. 9 shows a manner in which the state shown in FIG. 7 is viewed in the direction (front direction) of the arrow 100B, and FIG. 10 shows the power supply unit 10 of FIG. 8 as viewed in the direction (front direction) of the arrow 100C.

Figure 11:
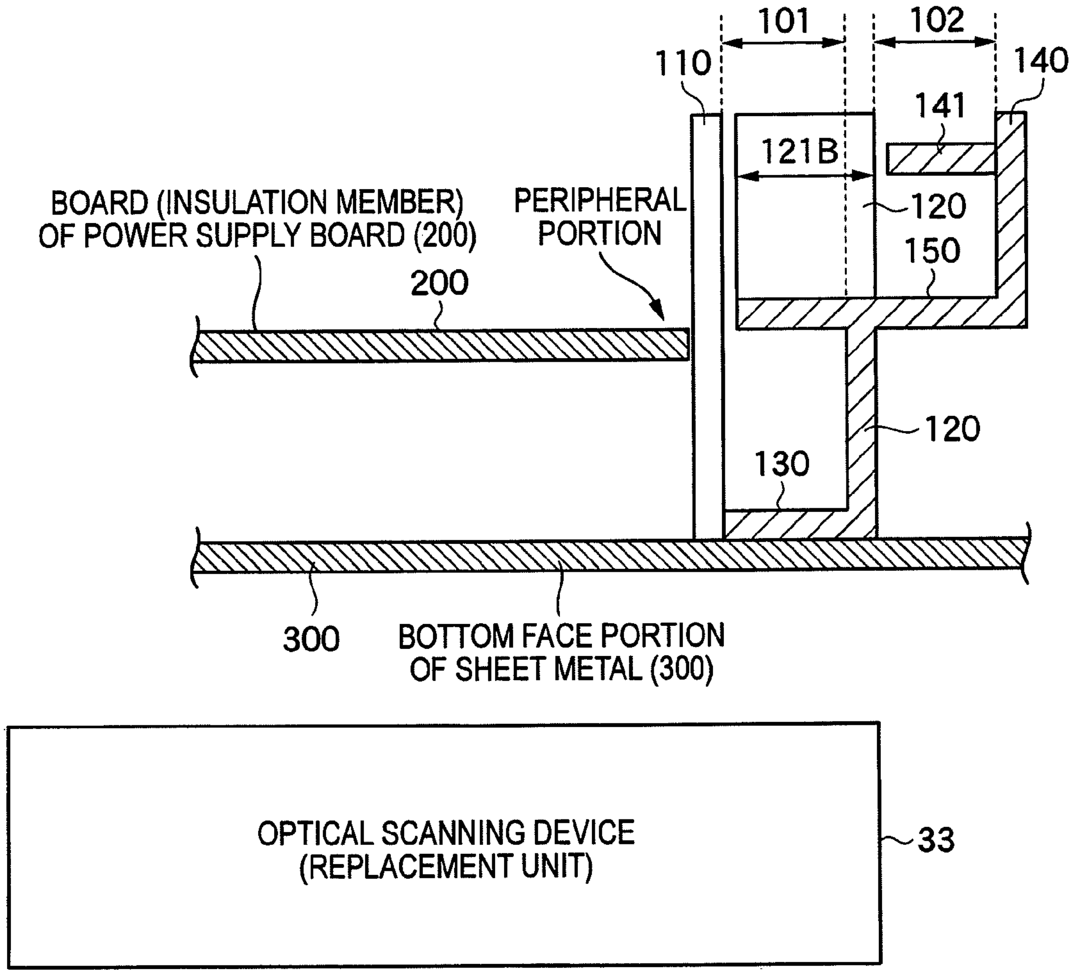
FIG. 11 is a view illustrating relationships among the insulation guide, power supply board, and replacement unit in the exemplary embodiment.

As shown in FIG. 11, the insulation guide 100 and the power supply board 200 are attached to the sheet metal 300 in a state where the structure related to the first wiring path 101 is in contact with or adjacent to a peripheral portion of the power supply board 200.

In the state where the insulation guide 100 and the power supply board 200 are attached to the sheet metal 300, the degree of restricting the first harness 201 from detaching from the first wiring path 101 is further enhanced as compared with the case of the insulation guide 100 which has not been attached to the sheet metal 300.

The optical scanning device 33 serving as a replacement unit is detachably disposed at a predetermined position which is below the sheet metal 300. The sheet metal 300 is fixed by, for example, screwing to a predetermined portion of the body (not shown) of the image forming apparatus 1.

When, after the insulation guide 100 and the power supply board 200 are detached from the sheet metal 300, the sheet metal 300 is detached, the upper side of the optical scanning device 33 is opened.

Figure 12:
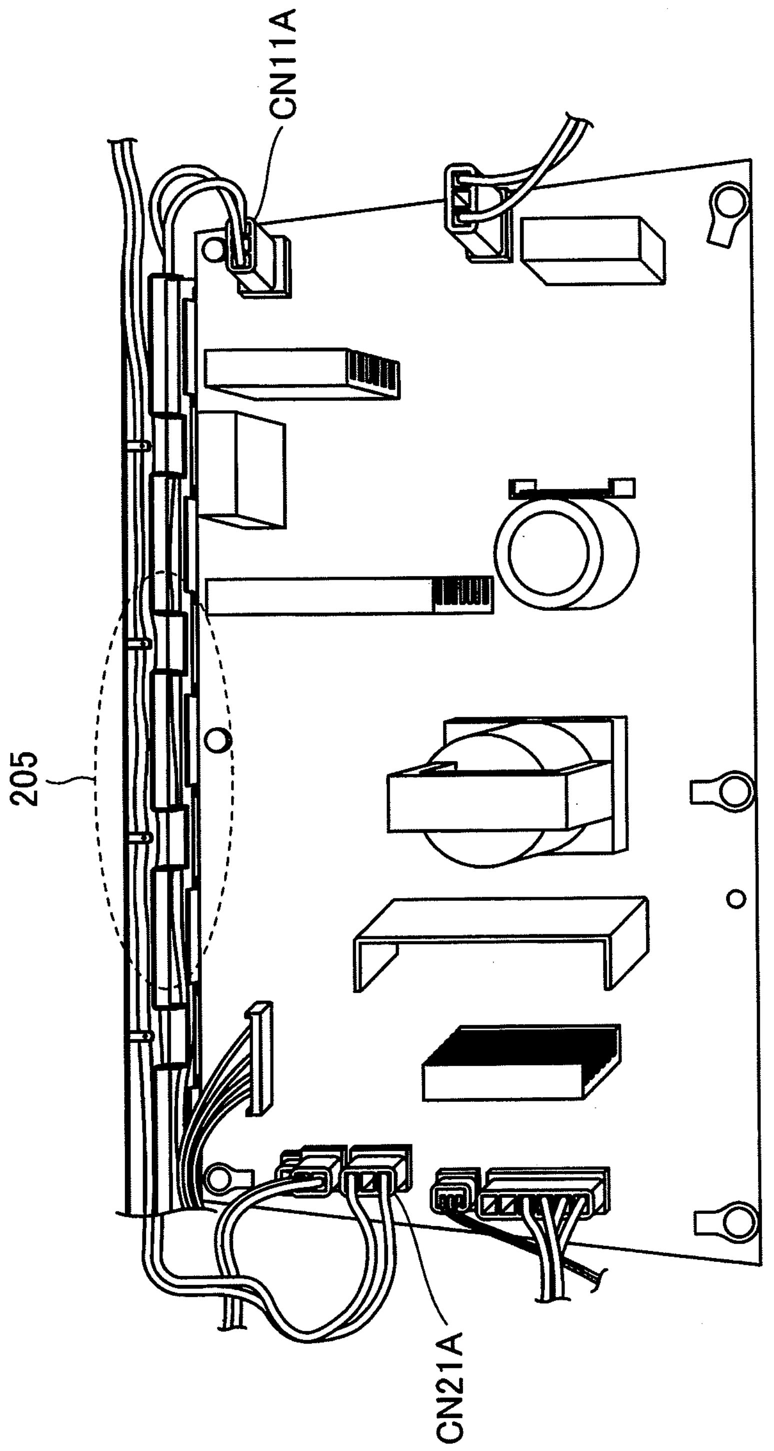
FIG. 12 is a view showing the manner of the power supply unit in which the insulation guide in which first and second harnesses in the exemplary embodiment are wired, and the power supply board are attached to the sheet metal.

FIG. 12 shows a manner (the power supply unit 10) in which the insulation guide 100 in which the first harness 201 and the second harness 202 are wired, and the power supply board 200 are attached to predetermined placement positions of the sheet metal 300.

Figure 13:
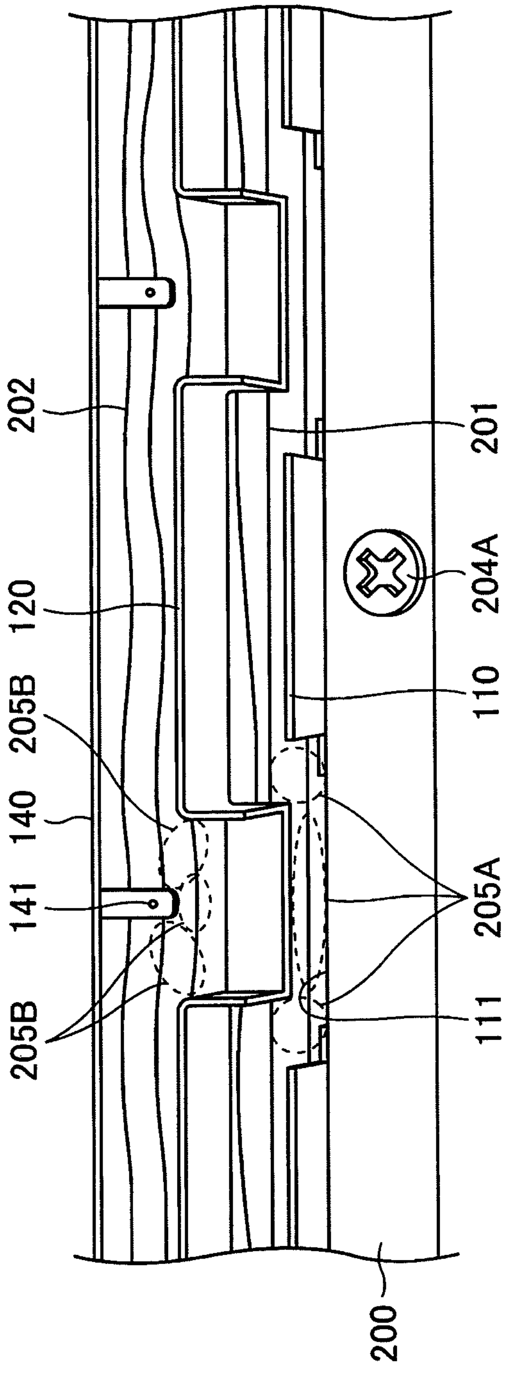
FIG. 13 is a view enlargedly showing a part of the power supply unit in which the insulation guide in which the first and second harnesses in the exemplary embodiment are wired, and the power supply board are attached to the sheet metal.
Figure 14:
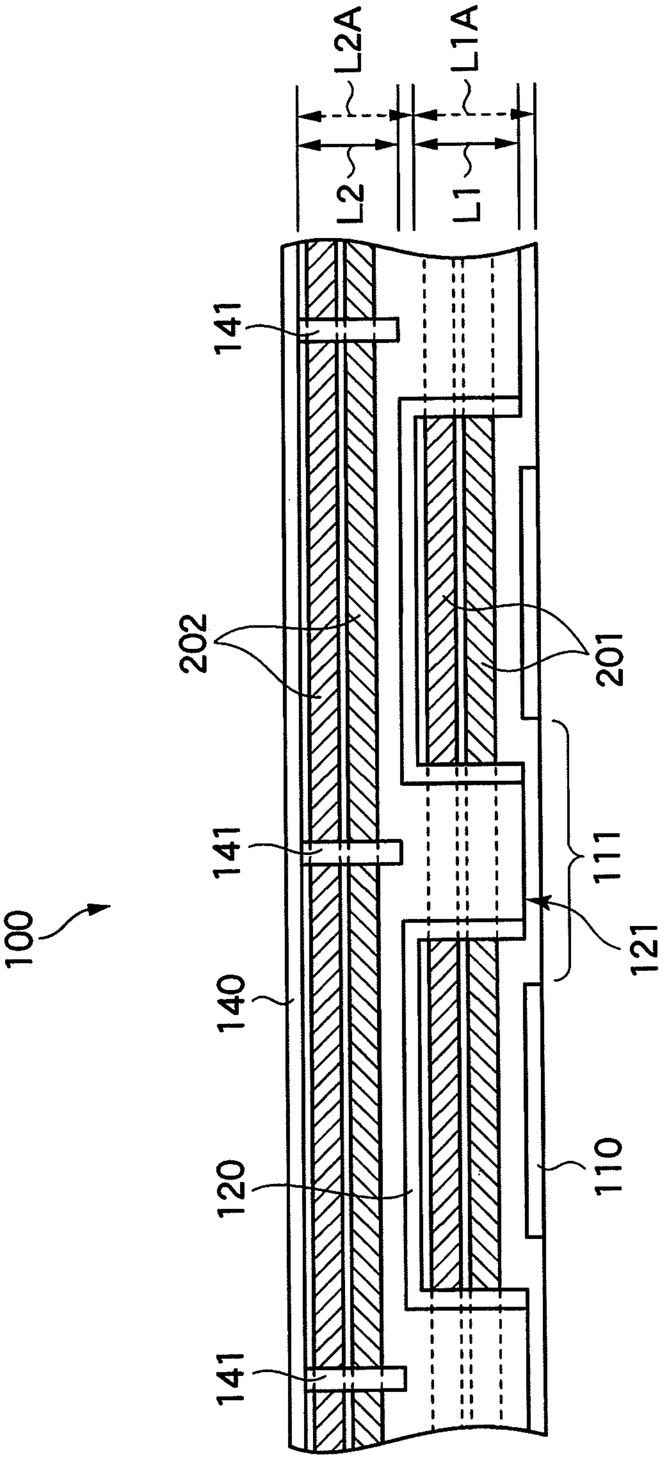
FIG. 14 is a view showing a part of the front of the insulation guide in which the first and second harnesses in the exemplary embodiment are wired.

In the power supply unit 10 shown in FIG. 12, a portion enclosed by a broken line denoted by the reference numeral 205 is enlargedly shown in FIG. 13. FIG. 14 shows the upper face (front face) of the insulation guide 100 in the case where attention is focused on the insulation guide 100 of the power supply unit 10 shown in FIG. 13.

In the power supply unit 10, the first harness 201 is prevented from being detached from the first wiring path 101, by using the spaces (regions) enclosed by broken lines denoted by the reference numeral 205A in FIG. 13.

In a state where the insulation guide 100 in which the first harness 201 and the second harness 202 are, and the power supply board 200 are attached to the sheet metal 300, even in the case where the connector CN11A of the first harness 201 which is wired in the insulation guide 100 is detached from the connector CN11B of the power supply board 200, detachment of the first harness 201 from the structure (insulation guide 100) related to the first wiring path 101 cannot be performed by using the spaces (regions) enclosed by the broken lines denoted by the reference numeral 205A.

In a state where the insulation guide 100 in which the first harness 201 and the second harness 202 are wired, and the power supply board 200 are attached to the sheet metal 300, in the case where the connector CN21A of the second harness 202 which is wired in the insulation guide 100 is detached from the connector CN21B of the power supply board 200, detachment of the second harness 202 from the structure (insulation guide 100) related to the second wiring path 102 can be performed by using the spaces (regions) enclosed by the broken lines denoted by the reference numeral 205B.

Figure 15:
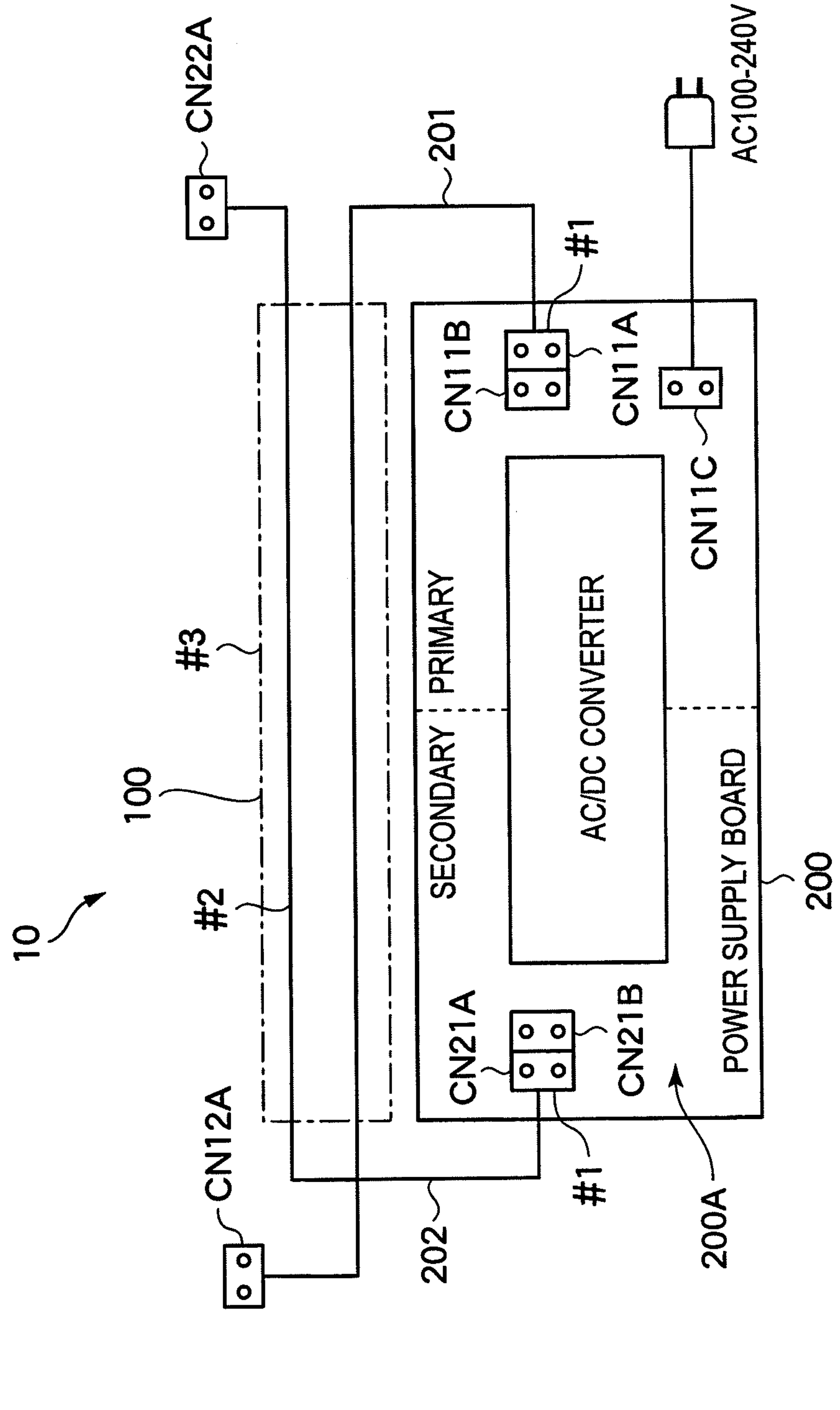
FIG. 15 is a view illustrating a method of attaching and detaching the power supply unit in the case where a desired work is performed on the replacement unit of the image forming apparatus of the exemplary embodiment.

Next, the method of attaching and detaching the power supply unit 10 in the case where a desired work is performed on the replacement unit (in the example, the optical scanning device 33) of the image forming apparatus 1 will be described with reference to FIG. 15.

As preconditions, it is assumed that the insulation guide 100 and the power supply board 200 are attached to the sheet metal 300, and the connectors at the both ends of the first harness 201 and the second harness 202 are connected to corresponding counter connectors, respectively.

The maintenance person performs following works (1) to (9).

(1) First, the connector CN11A of the first harness 201 is disconnected from the connector CN11B on the power supply board 200 (see #1), and the connector CN21A of the second harness 202 is disconnected from the connector CN21B on the power supply board 200 (see #1).

(2) Next, the second harness 202 is detached from (the structure which is related to the second wiring path 102, and which is in) the insulation guide 100 (see #2).

(3) Then, the insulation guide 100 to which the first harness 201 is attached is removed from the sheet metal 300 (see #3).

(4) Then, the six screws 204A of the power supply board 200 are removed, the power supply board 200 is thereafter removed from the sheet metal 300, and then the sheet metal 300 is removed from the apparatus body.

(5) Then, a desired work such as maintenance or component replacement is performed on the optical scanning device 33 serving as a replacement unit.

(6) When the work is ended as described above, the sheet metal 300 is attached to the apparatus body by screwing, and then the power supply board 200 is attached to the sheet metal 300 by screwing.

(7) The second harness 202 is wired in the second wiring path 102 of the removed insulation guide 100.

(8) The insulation guide 100 in which the second harness 202 is wired in addition to the wiring of the first harness 201 integrated with the structure related to the first wiring path 101 is attached the sheet metal 300.

(9) Finally, the connector CN11A of the first harness 201 is connected to the connector CN11B on the power supply board 200, and the connector CN21A of the second harness 202 is connected to the connector CN21B on the power supply board 200.

In the exemplary embodiment, as described above, the first harness (primary harness) which is wired in (the structure which is related to the first wiring path, and which is in) the insulation guide is in the state where the first harness is integrated with the insulation guide.

In the case where the insulation guide is detachably attached to the sheet metal, therefore, an event where contact or clamping between the first harness wired in the insulation guide and the sheet metal occurs is suppressed. Moreover, an occurrence of a scratch due to such an event in the covering member (insulating portion) of the first harness is suppressed. Therefore, insulation between the first harness and the sheet metal is ensured, and that between the first harness and the second harness is ensured. Namely, electrical security is secured.

In the case where the maintenance person performs a desired work (such as maintenance or component replacement) on, for example, the replacement unit (optical scanning device), the insulation guide attached to the sheet metal can be detached therefrom without detaching the first harness from the insulation guide. When, after the desired work is ended, the detached insulation guide is attached to the sheet metal, also the first harness is wired, and hence the first harness is prevented from being erroneously wired.

Although the invention conducted by the inventor has been specifically described on the basis of the exemplary embodiment, the exemplary embodiment disclosed in the specification is exemplarily shown in all aspects, and it is to be understood that the invention is not restricted to the disclosed techniques. Namely, the technical scope of the invention should not be restrictively interpreted on the basis of the description of the exemplary embodiment, and should be interpreted in accordance with the description of the appended claims. The invention includes techniques equivalent to those set forth in the claims, and all changes within the scopes of the claims.

The electronic apparatus of the invention may be applied to an image forming apparatus which executes at least one of monochrome printing and color printing by the electrophotographic process system or the ink-jet system.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention defined by the following claims and their equivalents.

What is claimed is:

1. An electronic apparatus comprising:

a power supply board having a power supply circuit which converts a primary power to a secondary power; and a wiring structure in which a first wiring path where a first harness that is used for transmitting the primary power to supply destinations of the primary power is wired, and a second wiring path where a second harness that is used for transmitting a secondary power to supply destinations of the secondary power is wired are formed, and, wherein, in the wiring structure, a structure related to the first wiring path is formed so that, in a case where the first harness is wired, the first harness is integrated with the structure related to the first wiring path, the first wiring path formed in a recessed shape by a first side face member, a second side face member, and a first bottom face member, and the second wiring path formed in a recessed shape by the second side face member, a third side face member, and a second bottom face member, a plurality of openings formed at predetermined intervals of the first side face member, a plurality of U-like members formed at predetermined intervals of the second side face member, and wherein the plurality of openings formed at predetermined intervals of the first side face member are horizontally opposed to the plurality of U-like members formed at predetermined intervals of the second side face member.

2. The electronic apparatus according to claim 1, wherein the structure related to the first wiring path is formed into a structure which restricts the first harness wired in the first wiring path, from detaching from the first wiring path.

3. The electronic apparatus according to claim 1, wherein the apparatus further comprises an attachment member to which the power supply board and the wiring structure are attached, in the wiring structure, the first wiring path is formed in a level which is at a lower height than the second wiring path, the wiring structure and the power supply board are attached to the attachment member in response to the structure related to the first wiring path in contact with or adjacent to a peripheral portion of the power supply board, and in response to the wiring structure and the power supply board attached to the attachment member, a degree of restricting the first harness from detaching from the first wiring path is further enhanced as compared with the wiring structure in which the wiring structure and the power supply board have not been attached to the attachment member.

4. The electronic apparatus according to claim 1, wherein a protecting unit which protects the power supply circuit or the destinations of the secondary power from an overcurrent is disposed in the secondary side of the power supply circuit of the power supply board.

5. The electronic apparatus according to claim 1, wherein the first side face member, the second side face member, and the third side face member of the wiring structure restrict the first harness and the second harness.

6. The electronic apparatus according to claim 2, wherein the apparatus further comprises an attachment member to which the power supply board and the wiring structure are attached, in the wiring structure, the first wiring path is formed in a level which is at a lower height than the second wiring path, the wiring structure and the power supply board are attached to the attachment member in response to the structure related to the first wiring path in contact with or adjacent to a peripheral portion of the power supply board, and in response to the wiring structure and the power supply board attached to the attachment member, a degree of restricting the first harness from detaching from the first wiring path is further enhanced as compared with a case of the wiring structure in which the wiring structure and the power supply board have not been attached to the attachment member.

7. The electronic apparatus according to claim 2, wherein a protecting unit which protects the power supply circuit or the destinations of the secondary power from an overcurrent is disposed in the secondary side of the power supply circuit of the power supply board.

8. The electronic apparatus according to claim 3, wherein the apparatus further comprises a replacement unit that is detachably disposed at a predetermined position which is below the attachment member, and when, after the wiring structure and power supply board which are attached to the attachment member are detached from the attachment member, the attachment member is detached, an upper side of the replacement unit is opened.

9. The electronic apparatus according to claim 3, wherein a protecting unit which protects the power supply circuit or the destinations of the secondary power from an overcurrent is disposed in the secondary side of the power supply circuit of the power supply board.

10. The electronic apparatus according to claim 6, wherein the apparatus further comprises a replacement unit that is detachably disposed at a predetermined position which is below the attachment member, and when, after the wiring structure and power supply board which are attached to the attachment member are detached from the attachment member, the attachment member is detached, an upper side of the replacement unit is opened.

11. The electronic apparatus according to claim 6, wherein a protecting unit which protects the power supply circuit or the destinations of the secondary power from an overcurrent is disposed in the secondary side of the power supply circuit of the power supply board.

12. The electronic apparatus according to claim 8, wherein a protecting unit which protects the power supply circuit or the destinations of the secondary power from an overcurrent is disposed in the secondary side of the power supply circuit of the power supply board.

13. The electronic apparatus according to claim 10, wherein a protecting unit which protects the power supply circuit or the destinations of the secondary power from an overcurrent is disposed in the secondary side of the power supply circuit of the power supply board.

14. An electronic apparatus comprising:

a power supply board having a power supply circuit which converts a primary power to a secondary power; and a wiring structure in which a first wiring path where a first harness that is used for transmitting the primary power to supply destinations of the primary power is wired, and a second wiring path where a second harness that is used for transmitting a secondary power to supply destinations of the secondary power is wired are formed, and, wherein, in the wiring structure, a structure related to the first wiring path is formed so that, in a case where the first harness is wired, the first harness is integrated with the structure related to the first wiring path, wherein the apparatus further comprises an attachment member to which the power supply board and the wiring structure are attached, in the wiring structure, the first wiring path is formed in a level which is at a lower height than the second wiring path, the wiring structure and the power supply board are attached to the attachment member in response to the structure related to the first wiring path in contact with or adjacent to a peripheral portion of the power supply board, and in response to the wiring structure and the power supply board attached to the attachment member, a degree of restricting the first harness from detaching from the first wiring path is further enhanced as compared with the wiring structure in which the wiring structure and the power supply board have not been attached to the attachment member, a plurality of openings formed at predetermined intervals of a first side face member, a plurality of U-like members formed at predetermined intervals of a second side face member, and wherein the plurality of openings formed at predetermined intervals of the first side face member are horizontally opposed to the plurality of U-like members formed at predetermined intervals of the second side face member.

15. A wiring structure for an electronic apparatus, comprising a structure in which a first wiring path where a first harness that is used for transmitting a primary power is wired and a second wiring path where a second harness that is used for transmitting a secondary power is wired are formed, wherein a structure related to the first wiring path is formed so that, in a case where the first harness is wired, the first harness is integrated with the structure related to the first wiring path, wherein the structure includes a power supply board having a power supply circuit which converts the primary power to the secondary power, wherein the structure includes the first wiring path formed in a recessed shape by a first side face member, a second side face member, and a first bottom face member, and wherein the structure includes the second wiring path formed in a recessed shape by the second side face member, a third side face member, and a second bottom face member, a plurality of openings formed at predetermined intervals of the first side face member, a plurality of U-like members formed at predetermined intervals of the second side face member, wherein the plurality of openings formed at predetermined intervals of the first side face member are horizontally opposed to the plurality of U-like members formed at predetermined intervals of the second side face member, wherein the apparatus further comprises an attachment member to which the power supply board and the wiring structure are attached, wherein in the wiring structure, the first wiring path is formed in a level which is at a lower height than the second wiring path, wherein the wiring structure and the power supply board are attached to the attachment member in response to the structure related to the first wiring path in contact with or adjacent to a peripheral portion of the power supply board, and wherein in response to the wiring structure and the power supply board attached to the attachment member, a degree of restricting the first harness from detaching from the first wiring path is further enhanced as compared with a case of the wiring structure in which the wiring structure and the power supply board have not been attached to the attachment member.

* * * * *